United States Patent
Benjamin et al.

(10) Patent No.: US 11,640,487 B2
(45) Date of Patent: *May 2, 2023

(54) COMPUTER-IMPLEMENTED METHOD FOR SPACE FRAME DESIGN, SPACE FRAME CONSTRUCTION KIT AND SPACE FRAME

(71) Applicant: AUTODESK, INC., San Francisco, CA (US)

(72) Inventors: David Benjamin, New York, NY (US); Danil Nagy, New York, NY (US); Damon Lau, New York, NY (US); Dale Zhao, New York, NY (US)

(73) Assignee: AUTODESK, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/496,677

(22) Filed: Oct. 7, 2021

(65) Prior Publication Data
US 2022/0100920 A1 Mar. 31, 2022

Related U.S. Application Data

(60) Continuation of application No. 16/831,671, filed on Mar. 26, 2020, now Pat. No. 11,126,760, which is a
(Continued)

(51) Int. Cl.
*G06F 17/00* (2019.01)
*G06F 30/17* (2020.01)
(Continued)

(52) U.S. Cl.
CPC .............. *G06F 30/17* (2020.01); *B33Y 80/00* (2014.12); *B64C 1/08* (2013.01); *B64D 11/0023* (2013.01); *B64F 5/00* (2013.01); *Y02T 50/40* (2013.01)

(58) Field of Classification Search
CPC ....................................................... G06F 17/50
(Continued)

(56) References Cited

U.S. PATENT DOCUMENTS 5,746,035 A 5/1998 Seiber et al.
6,378,265 B1 4/2002 Konstandt
(Continued)

FOREIGN PATENT DOCUMENTS

DE 10 2010 064 100 A1 6/2012
EP 3 173 953 A1 5/2017
(Continued)

OTHER PUBLICATIONS

Tero et al., "A mathematical model for adaptive transport network in path finding by true slime mold", https://doi.org/10.1016/j.jtbi.2006.07.015, Journal of Theoretical Biology, vol. 244, No. 4, Feb. 21, 2007, pp. 553-564.
(Continued)

*Primary Examiner* — Andy Ho
(74) *Attorney, Agent, or Firm* — Artegis Law Group, LLP

(57) ABSTRACT

A computer-implemented method for space frame design involves constructing a load stress map in a geometrical boundary representation of a design space, defining attachment points and load application points in the design space, creating a starting network of interconnecting lines between each two of the attachment points and load application points in the design space, assigning load application factors to each line of the starting network of interconnecting lines based on values of the load stress map, generating potential space frame designs by culling different subsets of lines of the starting network of interconnecting lines for each potential space frame design according to variable culling parameters, evaluating the potential space frame designs with respect to optimization parameters, combining the culling
(Continued)

parameters for the potential space frame designs the performance score of which is above a predefined performance threshold, and iterating the steps of generating potential space frame designs and evaluating the potential space frame designs on the basis of the combined culling parameters.

25 Claims, 5 Drawing Sheets

Related U.S. Application Data continuation of application No. 15/713,572, filed on Sep. 22, 2017, now Pat. No. 10,606,981, which is a division of application No. 14/954,052, filed on Nov. 30, 2015, now Pat. No. 10,430,548.

(51) Int. Cl.
  *B64C 1/08* (2006.01)
  *B64D 11/00* (2006.01)
  *B64F 5/00* (2017.01)
  *B33Y 80/00* (2015.01)

(58) Field of Classification Search
  USPC .............................................................. 703/1
  See application file for complete search history.

(56) References Cited

U.S. PATENT DOCUMENTS

| | | | |
|---|---|---|---|
| 6,434,492 B1 * | 8/2002 | Pollack | G01M 5/0008 |
| | | | 702/41 |
| 8,776,610 B2 * | 7/2014 | Cummings | G01M 99/007 |
| | | | 73/818 |
| 8,960,602 B2 | 2/2015 | Neumann et al. | |
| 9,180,968 B2 | 11/2015 | Helfrich et al. | |
| 9,251,460 B2 | 2/2016 | Cantin et al. | |
| 9,975,179 B2 | 5/2018 | Czinger et al. | |
| 2017/0050677 A1 | 2/2017 | Czinger et al. | |
| 2018/0011965 A1 | 1/2018 | Benjamin et al. | |
| 2018/0085827 A1 | 3/2018 | Czinger et al. | |

FOREIGN PATENT DOCUMENTS

| | | |
|---|---|---|
| EP | 3 196 787 A1 | 7/2017 |
| WO | 2007/076357 A2 | 7/2007 |
| WO | 2014/111707 A1 | 7/2014 |

OTHER PUBLICATIONS

Tero et al., "Rules for Biologically Inspired Adaptive Network Design", DOI: 10.1126/science.1177894, available at www.sciencemag.org, vol. 327, No. 5964, Jan. 22, 2010, pp. 439-442.

Mottershead et al., "Selection and Updating of Parameters for An Aluminum Space-Frame Model", Mechanical Systems and Signal Processing, Academic Press, doi:10.1006/mssp.2000.1303, vol. 14, No. 6, 2000, pp. 923-944.

Fenton et al., "Automatic innovative truss design using grammatical evolution", https://doi.org/10.1016/j.autcon.2013.11.009, Automation in Construction, vol. 39, Apr. 1, 2014, pp. 59-69.

* cited by examiner

COMPUTER-IMPLEMENTED METHOD FOR SPACE FRAME DESIGN, SPACE FRAME CONSTRUCTION KIT AND SPACE FRAME

CROSS-REFERENCE TO RELATED APPLICATIONS

This application is a Continuation of the co-pending U.S. patent application titled, "COMPUTER-IMPLEMENTED METHOD FOR SPACE FRAME DESIGN, SPACE FRAME CONSTRUCTION KIT AND SPACE FRAME," filed on Mar. 26, 2020 and having Ser. No. 16/831,671, which is a Continuation of U.S. patent application titled, "COMPUTER-IMPLEMENTED METHOD FOR SPACE FRAME DESIGN, SPACE FRAME CONSTRUCTION KIT AND SPACE FRAME," filed on Sep. 22, 2017 and having Ser. No. 15/713,572, issued as U.S. Pat. No. 10,606,981, which is a Divisional of U.S. patent application titled, "COMPUTER-IMPLEMENTED METHOD FOR SPACE FRAME DESIGN, SPACE FRAME CONSTRUCTION KIT AND SPACE FRAME," filed on Nov. 30, 2015 and having Ser. No. 14/954,052, issued as U.S. Pat. No. 10,430,548. The subject matter of these related applications is hereby incorporated herein by reference.

BACKGROUND OF THE INVENTION

Technical Field

The present disclosure relates to a computer-implemented method for space frame design, a space frame construction kit and a space frame constructed with a space frame construction kit designed with a computer-implemented method.

Background

Beams, joists and frames for construction work, for example in aeronautics, civil engineering or architecture, are designed to withstand bending forces acting perpendicular to the direction of extension of the respective beams. Conventional beams may be implemented as an integral part with flanges at the edges and a web spanning between the flanges. Alternatively, instead of a web, cutter milled struts may be implemented between parallel running longitudinal support bars, thus leading to decreased weight of the beam due to less material being used to form the beam.

In order to save weight on board of aircraft, there have been several attempts to optimize the design of structural aircraft components. For example, document WO 2014/111707 A1 discloses a method for designing an object that includes analysing a digital model corresponding to the object for portions that have been determined to, during use of the object, experience relatively high stresses. Those high stress regions are used to determine which portions of the object are to be produced using an Additive Manufacturing (AM) process, and which portions of the object are to be produced using a different suitable process, for example a machining process. Document DE 10 2010 064 100 A1 discloses a partition wall for separating cabin areas of an aircraft with a sandwich-like surface structure.

Structural topology optimization methods for designing structural objects according to predefined design criteria have for example been disclosed in the document WO 2007/076357 A2.

The document U.S. 2009/0224103 A1 discloses a partition wall in an aircraft including a support element composed of individually formed system components and a tension-mounted material supported by the support element to form an area-shaped partition wall.

There is, however, a need for structural components in aircraft that have a lower overall weight while at the same time maintaining mechanical stability and the ability to effectively take up stress-induced loads.

SUMMARY OF THE INVENTION

One idea, feature, and/or object of the disclosure herein is therefore to provide solutions for optimizing the structural topology of structural aircraft components in order to decrease the amount of material needed for building the components.

A first aspect of the disclosure pertains to a computer-implemented method for space frame design, the method comprising constructing a load stress map in a geometrical boundary representation of a design space, defining a plurality of attachment points and load application points in the design space, creating a starting network of interconnecting lines between each two of the plurality of attachment points and load application points in the design space, assigning load application factors to each line of the starting network of interconnecting lines based on values of the load stress map, generating a plurality of potential space frame designs by selectively culling different subsets of lines of the starting network of interconnecting lines for each potential space frame design according to variable culling parameters, evaluating the performance score of each of the plurality of potential space frame designs with respect to a number of predefined optimization parameters, combining the culling parameters for the potential space frame designs the performance score of which is above a predefined performance threshold, and iterating the steps of generating potential space frame designs and evaluating the potential space frame designs on the basis of the combined culling parameters.

According to a second aspect of the disclosure, a space frame construction kit comprises plurality of space frame rods designed according to the first aspect of the disclosure, and a plurality of connectors for connecting the plurality of space frame rods to a space frame.

According to a third aspect of the disclosure, a space frame comprises a plurality of space frame rods designed according to the first aspect of the disclosure.

According to a fourth aspect of the disclosure, a structural aircraft component comprises a substantially planar core panel having a space frame structure of load bearing space frame rods, with each of the space frame rods designed according to the first aspect of the disclosure.

According to a fifth aspect of the disclosure, a computer-readable storage medium comprises computer-executable instructions which, when executed on a data processing apparatus, cause the data processing apparatus to perform the computer-implemented method according to the first aspect of the disclosure.

In the beginning, a two-staged evolutionary route finding algorithm is used for constructing a lightweight space frame structure optimized towards high mechanical stability and efficient load transfer and distribution. In a first stage, an adaptive dynamics scheme for heuristically determining a macroscopic space frame model following the most prominent load paths is employed. The adaptive dynamics scheme of the first stage is derived from the adaptive dynamics of a transport network of the amoeboid organism *Physarum polycephalum*. An optimization engine varies the input values of a pre-defined parametric model, produces a variety of space frame design options, and discards the lowest performing design options after a performance evaluation with a simplified and therefore rapidly working finite element (FE) model. The initial parameters of the surviving designs are used as starting point for the evolution of better performing designs, thereby approaching the pareto frontier as stop criterion for the algorithm.

Then, in a second stage, the microstructure of each of the space frame members determined in the first stage is evolved using a growth algorithm that iteratively adds member material in each of the space frame members in the direction of principal stress. The algorithm mimics the way bones and tissues grow in mammal bodies. Maximum strain failure may here be used as the stop criterion of the iterative optimization loop.

The generatively designed space frame structure is integrated into a surrounding carrier frame shaping the appearance of the structural component and adapting it to the surrounding structures in the aircraft. The generative design approach advantageously evaluates a large number of design options optimizing for both low weight and low structural deformation. Thus, this approach is able to reach weight reduction of up to 45% as compared to conventional honeycomb core sandwich structures while maintaining equal structural performance.

The designed model is then taken as a basis for manufacturing the space frame members in additive manufacturing processes. For greater flexibility, the space frame members may be divided in sub-components with appropriate joint mechanisms. Particularly advantageous may additionally be the reduction of costs, weight, lead time, part count and manufacturing complexity coming along with employing any kind of layer manufacturing technology when designing the components of the space frame, specifically the space frame rods and/or the concomitant connectors.

According to an embodiment of the computer-implemented method, the culling parameters may be selected from the group of global line density, local line density and line length.

According to a further embodiment of the computer-implemented method, the computer-implemented method may further comprise enriching the starting network of interconnecting lines with reinforcement lines between a node on one of the interconnecting lines and one of the plurality of attachment points and load application points in the design space or between two nodes on neighboring ones of the interconnecting lines. In some embodiments, the culling parameters may then additionally be selected from the group of node position on the interconnecting lines and length of the reinforcement lines.

According to a further embodiment of the computer-implemented method, evaluating the performance score of each of the plurality of potential space frame designs may be performed using a finite element analysis.

According to a further embodiment of the computer-implemented method, the potential space frame designs may be clustered in a multi-variate optimization parameter diagram to find space frame designs near the Pareto frontier.

According to a further embodiment of the computer-implemented method, the iteration of the steps of generating potential space frame designs and evaluating the potential space frame designs may be terminated when the increment in performance score for subsequently generated potential space frame designs falls below a termination threshold.

According to a further embodiment of the computer-implemented method, the method may further comprise generating a truss model with a microstructural framework for each line in the network of lines of selected ones of the potential space frame designs on the basis of corresponding values of the load stress map. In some specific embodiment, the truss models may then be employed as input geometry for an additive manufacturing, AM, process for manufacturing a plurality of space frame rods. In some embodiments, the plurality of space frame rods may be sub-divided into a number of partial space frame rods having a predefined maximum length.

According to an embodiment of the space frame construction kit, at least a first one of the space frame rods comprises an angled pin connector integrally formed at an end portion of the first space frame rod with angled pins being spaced apart from and protruding parallel to an end face of the first space frame rod, and wherein at least a second one of the space frame rods comprises an angled socket connector integrally formed at an end portion of the second space frame rod with angled tubes as sockets for the angled pins of the first space frame rod, the angled tubes being spaced apart from and protruding parallel to an end face of the second space frame rod.

BRIEF DESCRIPTION OF THE DRAWINGS

The disclosure herein will be explained in greater detail with reference to exemplary embodiments depicted in the drawings as appended.

The accompanying drawings are included to provide a further understanding of the present disclosure and are incorporated in and constitute a part of this specification. The drawings illustrate the embodiments of the present disclosure and together with the description serve to explain the principles of the disclosure herein. Other embodiments of the present disclosure and many of the intended advantages of the present disclosure will be readily appreciated as they become better understood by reference to the following detailed description. The elements of the drawings are not necessarily to scale relative to each other. Like reference numerals designate corresponding similar parts.

DETAILED DESCRIPTION

Figure 1:
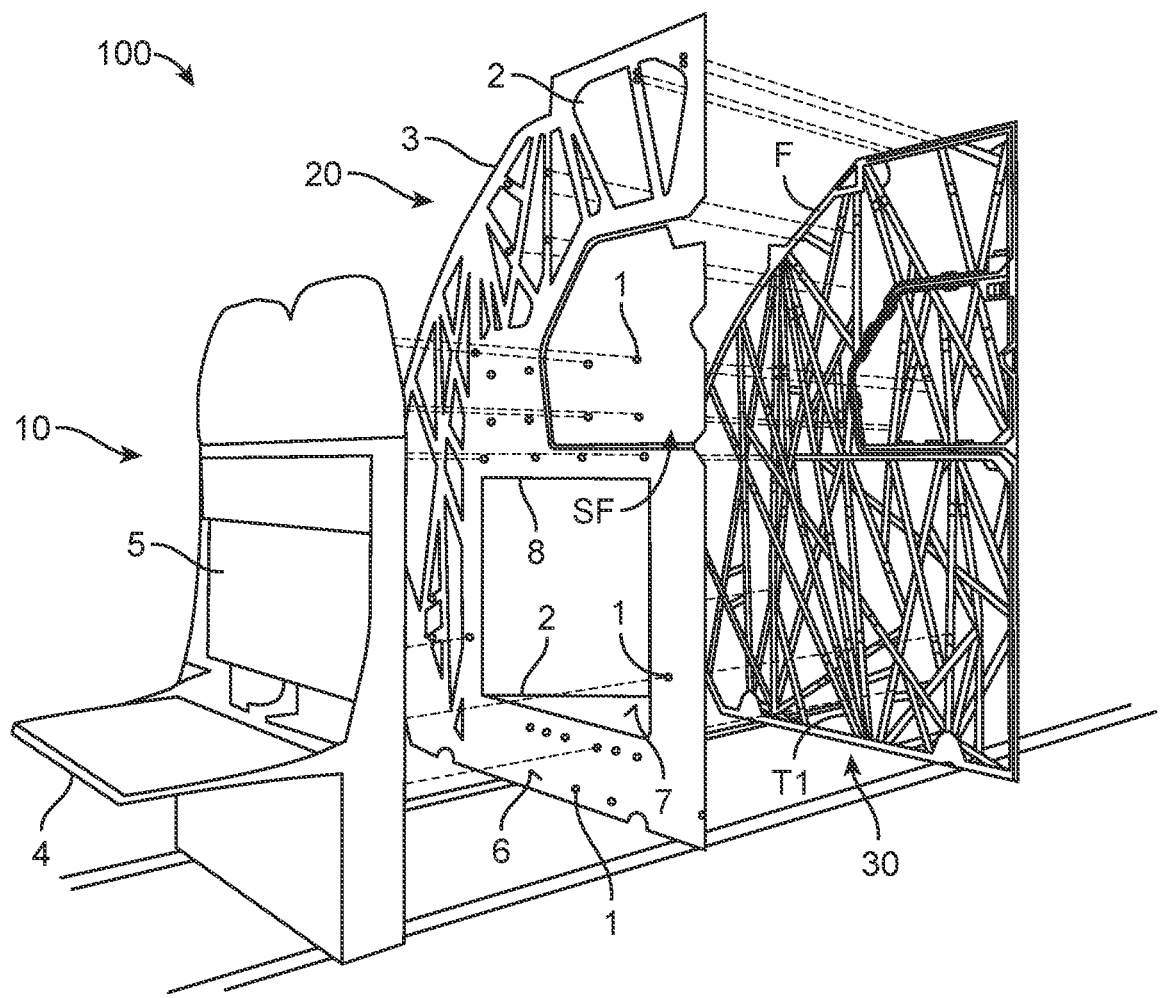
FIG. 1 schematically illustrates an explosion view of components of a partition element of an aircraft according to an embodiment of the disclosure herein.

In the figures, like reference numerals denote like or functionally like components, unless indicated otherwise.

Any directional terminology like "top", "bottom", "left", "right", "above", "below", "horizontal", "vertical", "back", "front", and similar terms are merely used for explanatory purposes and are not intended to delimit the embodiments to the specific arrangements as shown in the drawings.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. Generally, this application is intended to cover any adaptations or variations of the specific embodiments discussed herein.

Some of the components, elements and assemblies as disclosed hereinforth may be fabricated using free form fabrication (FFF), direct manufacturing (DM), fused deposition modelling (FDM), powder bed printing (PBP), laminated object manufacturing (LOM), stereolithography (SL), selective laser sintering (SLS), selective laser melting (SLM), selective heat sintering (SHS), electron beam melting (EBM), direct ink writing (DIW), digital light processing (DLP) and/or additive layer manufacturing (AM). Those techniques belong to a general hierarchy of additive manufacturing (AM) methods. Often termed as 3D printing, those systems are used for generating three-dimensional objects by creating a cross-sectional pattern of the object to be formed and forming the three-dimensional solid object by sequentially building up layers of material. Any of such procedures will be referred to in the following description as AM or 3D printing without loss of generality. AM or 3D printing techniques usually include selectively depositing material layer by layer, selectively fusing or solidifying the material and removing excess material, if needed.

3D or AM techniques may be used in procedures for building up three-dimensional solid objects based on digital model data. 3D/AM employs an additive process where layers of material are sequentially built up in different shapes. 3D/AM is currently used for prototyping and distributed manufacturing with multiple applications in engineering, construction, industrial design, automotive industries and aerospace industries.

Space frames within the meaning of the present disclosure may encompass any truss-like structure consisting of or comprising a plurality of construction elements organized in a geometrical assemblage in space. The construction elements are shaped in such a way that forces being applied to the assemblage act substantially only on two points of the construction elements. The construction elements may themselves have any desired shape or form, being interconnected to other construction elements at joints or nodes of the assemblage.

FIG. 1 shows an explosion view of components of a partition element 100 of an aircraft in a schematic illustration. The partition element 100 may for example as a divider wall between different areas in the cabin of a passenger aircraft. The partition element 100 is exemplary depicted in FIG. 1 as a full-height partition that may for example be installed in in an aft area of a passenger aircraft. The partition element 100 may for example serve as separating wall between the aft galley and the passenger compartment. The partition element 100 may be implemented as a line- and retrofit solution using the same interfaces to the airframe as other or conventional partition elements. Of course, the partition element 100 serves only as an example for the purposes of description and explanation of some features and aspects of the disclosure herein, and other structural aircraft components may implemented as well following the very same principles as set out in conjunction with the partition element 100 of FIG. 1.

The partition element 100 may in some embodiments generally include a substantially planar core panel 30 having a space frame structure T1 of load bearing space frame rods RM in the back of the element 100, a cover panel 20 that is mounted at a front face of the core panel 30, and an attachment panel 10 configured to attach functional elements to the partition element 100. The attachment panel 10 may for example be adapted to mount a wall-mounted cabin attendant seat bench 5 (CAS bench) with a pivotable seat 4 to the partition element 100. The partition element 100 may in particular be designed to comply with FAA airworthiness standards, for example the 16 g dynamic test.

The cover panel 20 may include a substantially rigid protection cover 3 with a front face 6 and at least one fabric panel 7 mounted to the protection cover 3 from its backside, so that the fabric panel 7 is sandwiched between the core panel 30 and the protection cover 3 when the cover panel 20 is attached to the core panel 30. As shown in FIG. 1, the protection cover 3 may in general have an outer shape corresponding to the outer shape of the core panel 30. One or more cutout apertures 2 of various shapes may be cut out from the material of the protection cover 3. The protection cover 3 may for example be made from fibre-reinforced polymer material, such as for example glass fibre-reinforced polymer, GFRP, material, natural fibre-reinforced polymer, NFRP, material and carbon fibre-reinforced polymer, CFRP, material.

The cutout apertures 2 may be matched to the shape of the space frame structure T1 of the core panel 30 in a way that the space frame rods RM are covered from the front side by the cover panel 3 and at least some of the interspaces between neighboring space frame rods RM are visible through the cutout apertures 2 of the cover panel 20.

The fabric panel(s) 7 are mounted to the protection cover 3 and preferably cover some or all of the cutout apertures 2 from the backside of the cover panel 20. The fabric panel(s) 7 may for example be fastened to the protection cover 3 with hook-and-pile fasteners and may themselves comprise hook-and-pile fasteners on their backside to attach the fabric panel(s) 7 to the core panel 30. It may be advantageous to have the outer shape of the fabric panel(s) 7 to match the outer shape of the respective cutout aperture(s) 2, in a sense that the outer shape of the fabric panel(s) 7 is congruent to the outer shape of the cutout aperture(s) 2. The size of the fabric panel(s) 7 may in particular be larger than the size of the corresponding cutout aperture(s) 2, so that a fastening flange portion reaches over the outer rim of the cutout aperture(s) 2 behind the protection cover 3. Those fastening flange portions may then be fastened to the protection cover 3 around the rim, for example by aforementioned hook-and-pile fasteners.

A plurality of bores or holes 1 may be drilled or otherwise brought into the protection cover 3 and the fabric material behind the protection cover 3, if necessary. The bores 1 may serve as holes for fastening members that may connect the whole cover panel 20 to the core panel 30 which may comprise correspondingly positioned bores in the space frame rods RM and/or the carrier frame portion as well.

In order to avoid sharpened edges along the inner rim of the cutout aperture(s) 2, rim protectors 8 may be formed around those rims. The rim protectors 8 may for example comprises a U-shaped elongated profile member. Such profile members may be manufactured in Additive Manufacturing, AM, processes.

The cover panel 20 offers new customization possibilities for airlines as the cover of the partition is independent from the core panel 30 to which it is attached. Customers can choose between different cover concepts such as "closed" flat covers, the flexible integration of fabrics, or the integration of light and other features such as screens or displays. Moreover, decorative frames or panel elements may be easily and replaceably arranged on the smooth front side of the protection cover, thereby offering vast opportunities for individual airline branding and the generation of any desired corporate design.

Figure 2:
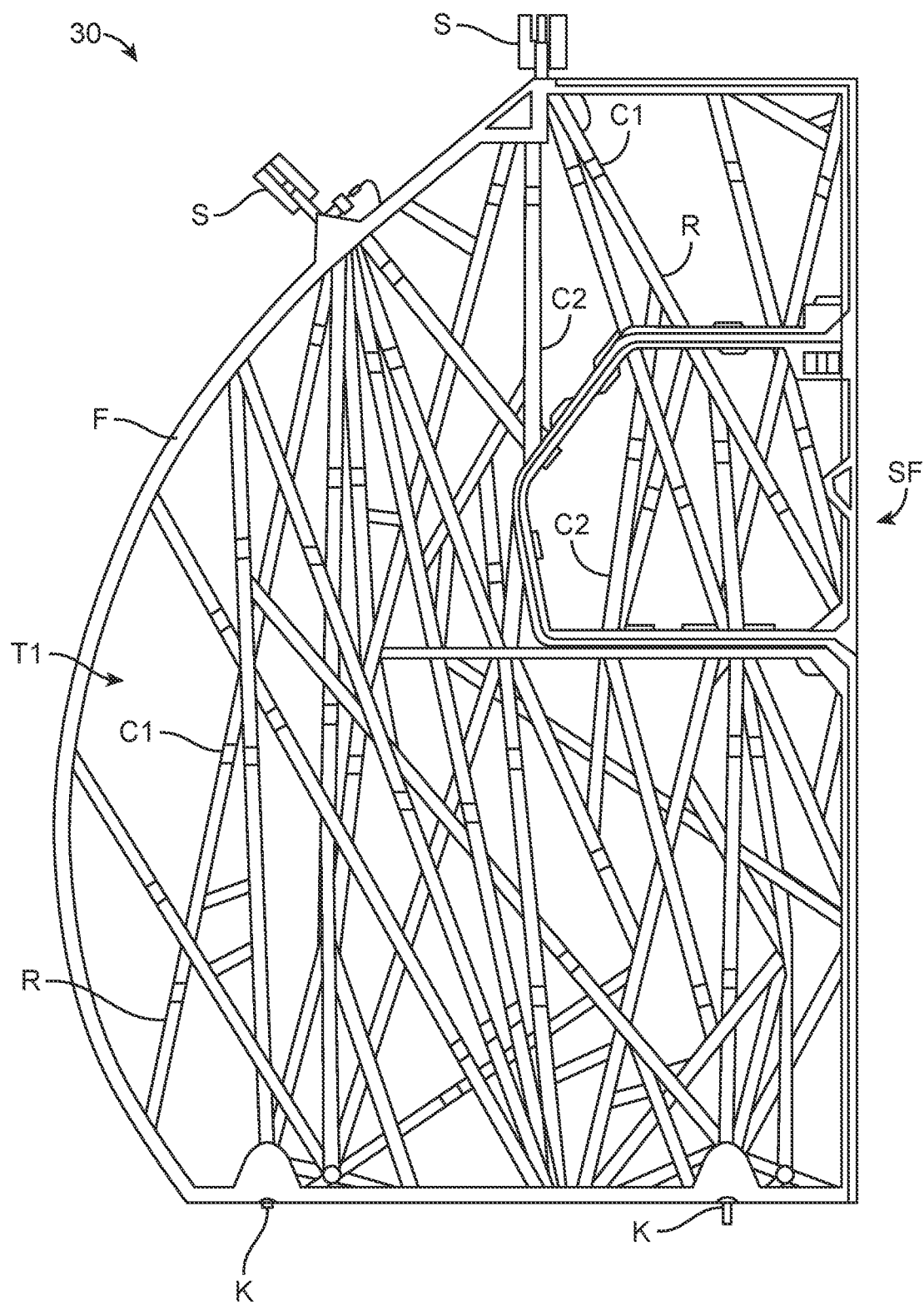
FIG. 2 schematically illustrates a front view of a core panel of the partition element in FIG. 1 according to another embodiment of the disclosure herein.

The core panel 30 as depicted in FIG. 1 is shown in FIG. 2 from the front in higher detail. Both the core panel 30 and the cover panel 20 may have a recessed inner frame at the position of a stretcher flap SF. The stretcher flap SF may be configured to provide access to a stowage area of a stretcher, for example a stretcher as carriage for stretcher patients on board of the aircraft. The outer shape of the core panel 30 is generally matched to the inner shape of the fuselage section to which the core panel 30 may be attached, for example by tie rods attached to hinged interfaces S of the fuselage structure. At the floor portion of the cabin, the core panel 30 may for example be fastened to the cabin by bolts at cabin anchor points K. The anchor points K as well as the attachments points of the tie rods for the hinged interfaces S may be reinforced and locally thickened in order to guarantee a smooth and reliable load transfer path into the surrounding fuselage structure.

The core panel 30 of FIG. 2 is generally built up with a macroscopic space frame structure T1 of a plurality of partially intersecting space frame rods R. The particular arrangement of the space frame rod models RM may for example be determined by a computer-implemented design procedure that employs metaheuristic optimization algorithms for optimizing the load paths through the truss of space frame rods R. The core panel 30 may in general comprise a carrier frame F running around the edges of the outer shape of the core panel 30 and the space frame structure T1 extending within the plane spanned by the carrier frame F. The overall thickness of the core panel 30 may in particular be less than 3 cm.

All structural members of the core panel 30 may in particular be manufactured using an Additive Manufacturing, AM, process. The structural members of the core panel 30 may for example be made from a suitable material accessible by the AM process, such as for example Scalmalloy™. Scalmalloy™ is an aluminum-magnesium-scandium alloy (AlMgSc) that has been developed for high and very high-strength extrusions, offering exceptionally high fatigue properties and the same positive manufacturing propensities as AlMgSc sheet material. In some embodiments, the core panel 30 may be manufactured in parts so that smaller AM machines and systems may be used. For example, it may be possible to break down the structural topology of the space frame structure T1 into a number of sub-components R (of which two are exemplarily denoted with reference signs in FIG. 2 for illustrative purposes), such as for example 20 to 150 sub-components R that may be separately 3D-printed on different ALM systems. Each sub-component R may contain standardized connectors of different connector types C1 and C2 (of which two are exemplarily denoted with reference signs each in FIG. 2 for illustrative purposes) which allow for proper connection between respective sub-components R to be joined and for adjustment of tolerances between neighboring sub-components R. In case of damage, the affected sub-components R may be easily replaced at low cost. The connectors of the two different connector types C1 and C2 will be explained and described in conjunction with FIG. 7 below.

Figure 6:
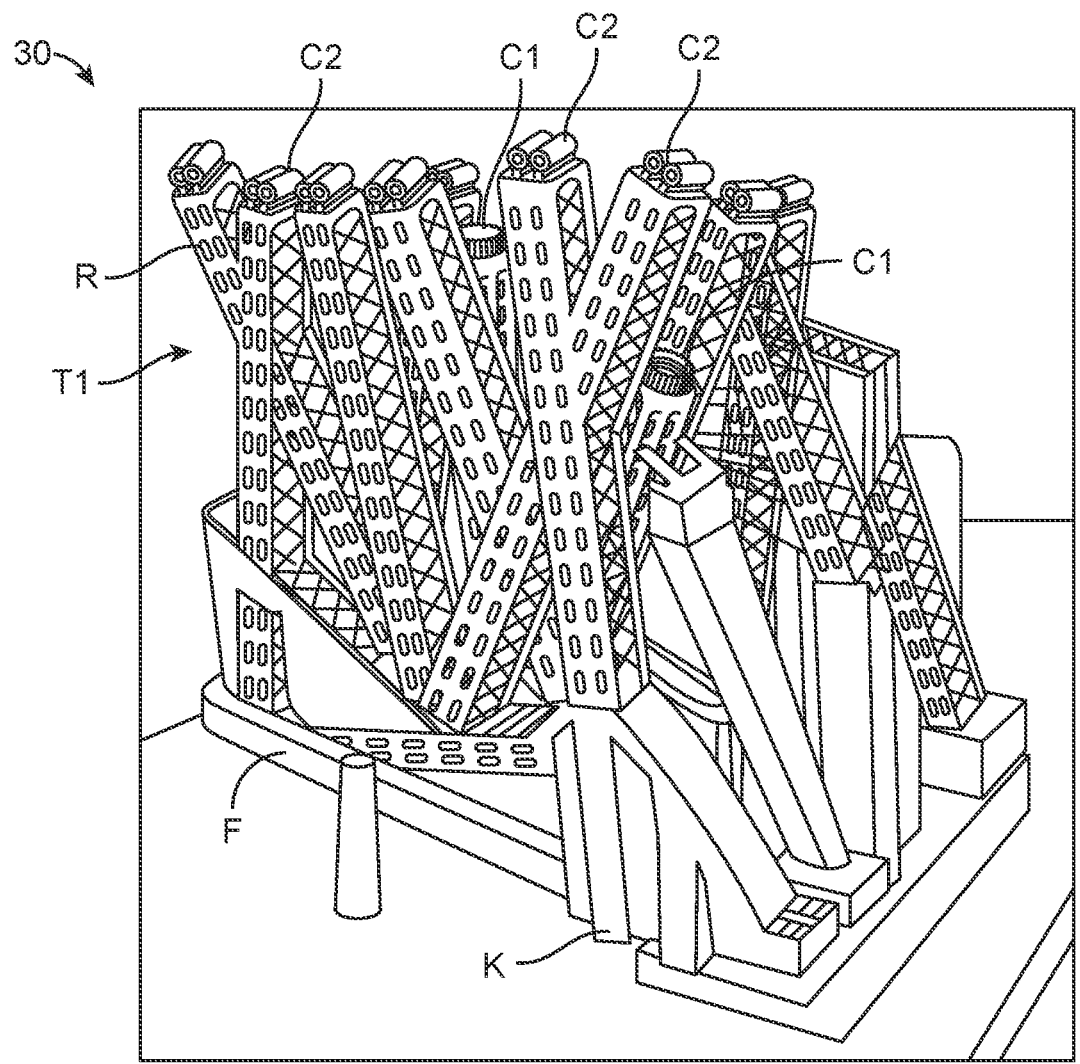
FIG. 6 schematically illustrates a perspective photograph of parts of the core panel of FIG. 2 according to another embodiment of the disclosure herein.

FIG. 6 depicts a perspective photograph of parts of the core panel 30 to better illustrate the shape and topology of the space frame assemblage of the core panel 30. As can be seen, the carrier frame on the bottom includes a thickened anchor point K for connecting the core panel 30 to the surrounding fuselage structure. Several lower ends of space frame rods R are shown to be integrally manufactured with the carrier frame as well as with each other. Each of the space frame rods R is in itself formed as a microscopic framework comprising a multitude of laterally and diagonally running struts which may be interconnected among each other at local nodes.

Figures 5A, 5B, 5C:
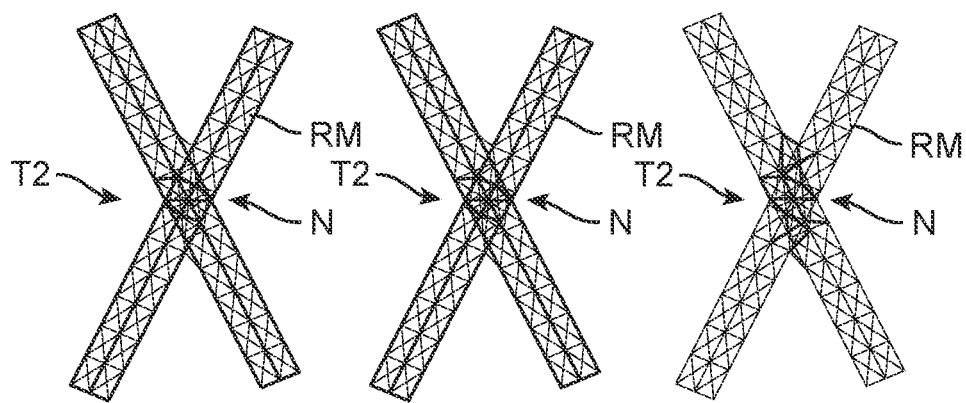
FIG. 5 schematically illustrates detail views of connection points of space frame rods in a core panel of FIG. 2 according to another embodiment of the disclosure herein.

The microscopic framework T2 is depicted in conjunction with FIG. 5 where three different interconnection node types (A), (B) and (C) between neighboring space frame rods are illustrated exemplarily. The microscopic framework T2 may be designed according to local load distributions that may be derived from load distribution models under pre-defined boundary conditions. In the node regions N between intersecting space frame rods, the laterally and diagonally running struts of the microscopic framework T2 of each of the space frame rods may be appropriately merged with each other. For each of the rods R, the core part of the rod may be formed as a truss structure, i.e. a structure consisting of two-force members which are assembled in a three-dimensional structure and connected as nodes. Typically, such truss structures may comprise polygonal constructed with straight members the ends and sometimes intermediate portions of which are connected at truss nodes. In the exemplary cases of FIGS. 5 and 6 the microscopic frameworks T2 take on the shape of a frame having four substantially parallel beams extending along the direction of extension of the space frame rod R and cross-hatched framework patches formed by diagonally staggered crossbeams between the four substantially parallel beams.

The topology of the space frame rods R themselves forms the macroscopic framework T1 that may have a generally two-dimensional layout, i.e. the space frame rods R are substantially lying in one plane of extension (in the illustrated example of the figures a vertically extending plane). Some or all of the space frame rods R may be equipped with connectors C1 or C2 on their respective rod end portions, which connector types are shown in greater detail in FIG. 7.

The connector type C1 may be a rod connector duct RH formed at the end portion of the space frame rods with an inner thread acting as a female connector portion for a male screw connector stud C. The connector stud C is formed integrally with an additive manufacturing, AM, process, for example from Scalmalloy™. At a first shank H1 of the connector stud C a left-handed outer thread portion is formed, while a second shank H2 that is located on the opposite side of the connector stud C is formed with a right-handed outer thread portion. If the connector stud C is inserted between two neighboring rods R which are both equipped with similar rod connector ducts RH at their ends, a turning motion D1 will create torque that causes both thread portions on the first and second shanks H1 and H2 to be simultaneously driven into their respective female threaded rod connector duct RH. In that way the rods to be joined by the connector type C1 may be pulled towards each other, with a variable distance in between the rods depending on the number of turns applied to the connector stud C. To aid the application of torque to the connector stud C, the connector stud comprises a wrenching contour G that is formed integrally with the first and second shank H1 and H2 in between both shanks. The thread formed at the first and second shank H1 and H2 may in particular have similar pitches. However, in some variants the threads for the first and second shank H1 and H2 may have different pitches, for example if a poka-yoke mechanism is to be put in place to prevent rods from being incorrectly installed in the space frame. The thread starts at the first and second shank H1 and H2 may be single start, however, in some variants a double start may be provided in order to provide more tolerance for assembly.

Figure 7:
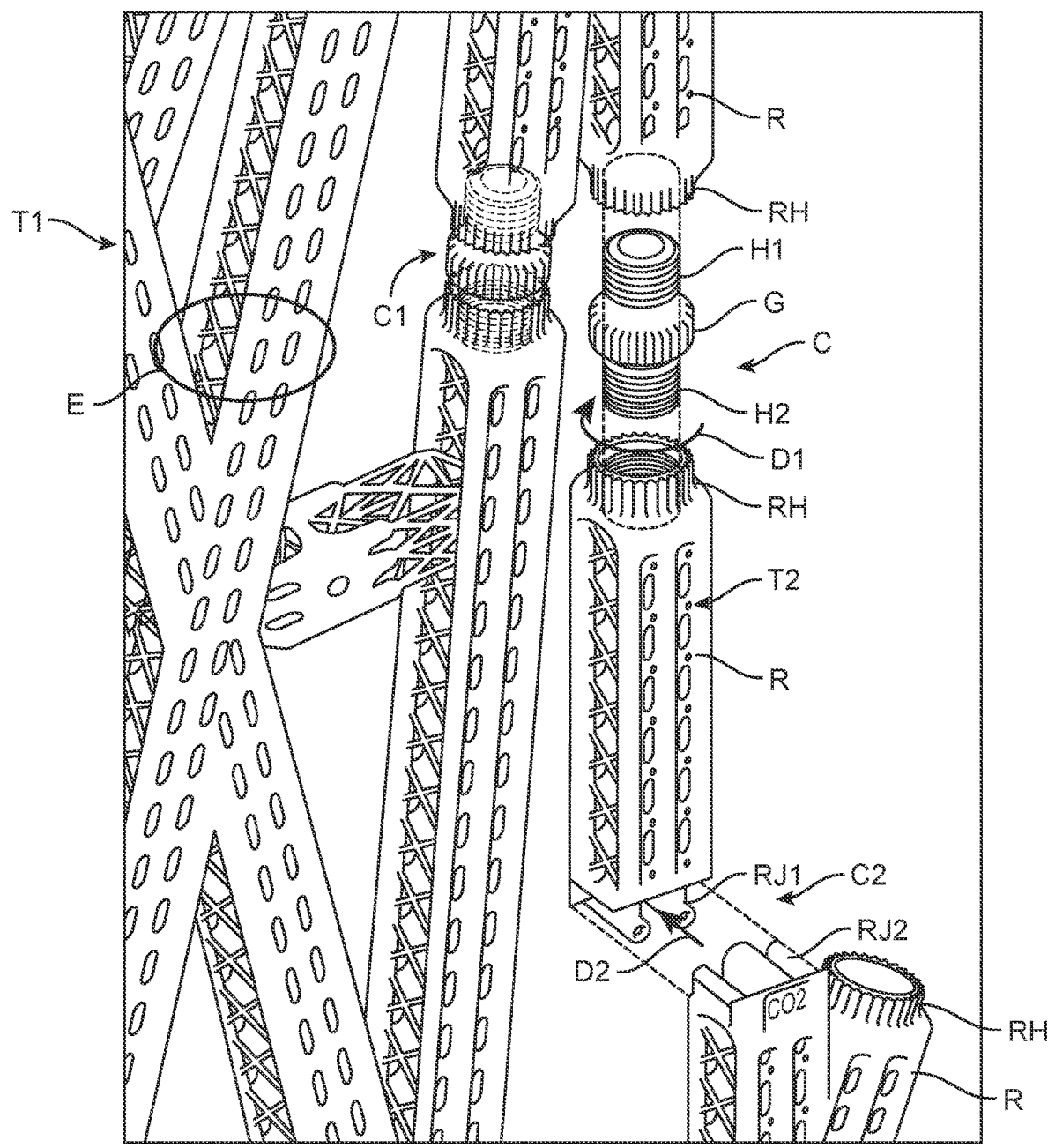
FIG. 7 schematically illustrates a detailed view of the connection types for space frame rods of the core panel of FIG. 2 according to even further embodiments of the disclosure herein.

The connector type C2 may be a half lap splice joint type, where a first connector portion RJ1 (as shown in FIGS. 6 and 7) is formed with angled pins being spaced apart from and protruding parallel to an end face of the space frame rod. A second connector portion RJ2 (not explicitly shown in FIG. 6, but in FIG. 7 only) is formed with correspondingly angled tubes as sockets for the pins being spaced apart from and protruding parallel to an end face of a space frame rod. The angled pins and the angled sockets may be brought into interlocking alignment with each other via a sliding or plugging motion D2 of two corresponding end portions of space frame rods to be connected. There may for example be two or more than two angled pins and correspondingly angled sockets that extend in parallel to each other. If there are at least two pins and sockets, the connection C1 is mechanically more stable against torsional moments.

The pins and sockets form an undercut in the direction of extension of the space frame rods that provides mechanical resistance against the joint between the space frame rods being pulled apart. In order to provide more grip between the pins and the inner walls of the sockets, the angled pins may be provided with a knurled outer surface, as may be exemplarily seen in the detail denoted with reference sign "E" in FIG. 7. The knurled outer surface may for example comprise a series of corrugations, ridges, or diamond patterns that create a large amount of slight indentations over the pin surface. This enlarges the effective contact surface between the outer surface of the angled pins and the inner walls of the angled sockets.

Both connector types C1 and C2 are designed to necessitate only very little movement of the space frame rods to be joined relative to each other. This facilitates connecting neighboring space frame rods R with little lateral movement. Particularly in complex structural topologies of core panels 30, there is generally little leeway for the space frame rods R to be displaced with respect to each other in terms of assembly. Thus, the connector types C1 and C2 are favorable connector types when assembling a complex structural aircraft component.

The space frame T1 may have a generally three-dimensional layout, i.e. for each first plane of extension defined by a subset of space frame rods R, another subset of rods R is connected to nodes of the former subset in a manner that defines at least one further second plane of extension being arranged under a non-zero angle with respect to the first plane of extension. The number of space frame rods R is generally not limited to any specific number, but instead their number will ultimately depend on the result of the optimization algorithm employed to find the optimal design of the space frame T1. Moreover, the number, kind, type and specific design of the connectors at the interconnection of adjoining space frame rods R may vary depending on the particular optimized design and/or the desired maximum length of a single space frame R.

Generally, a set of space frame rods R and a carrier frame F may form a space frame construction kit which may be used to construct the desired structural component, for example the core panel 30. The space frame construction kits as disclosed hereinforth may be used in a lot of applications, including—but not limited to—constructions of structural components in aircraft, interior design, bridge building, vehicle carriages, civil engineering, applications for children's toys and similar. A particular application pertains to the construction of core panels in structural aircraft components. Such core panels may include space frame rods for defining an overall outer shape of the structural aircraft components, for example within a component boundary predefined by a rigid outer carrier frame.

Figure 3:
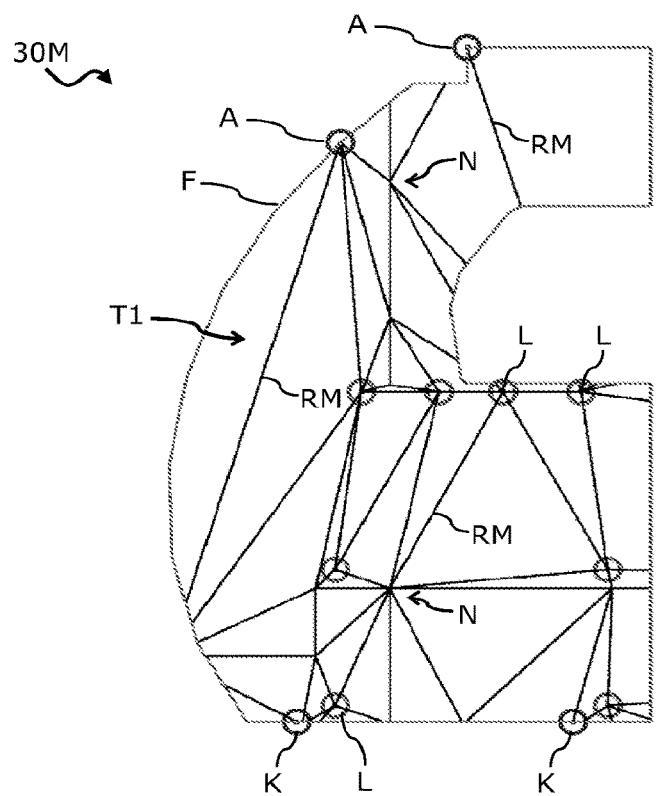
FIG. 3 schematically illustrates a computational stage for a digital simulation model of the core panel of FIG. 2 according to another embodiment of the disclosure herein.
Figure 4:
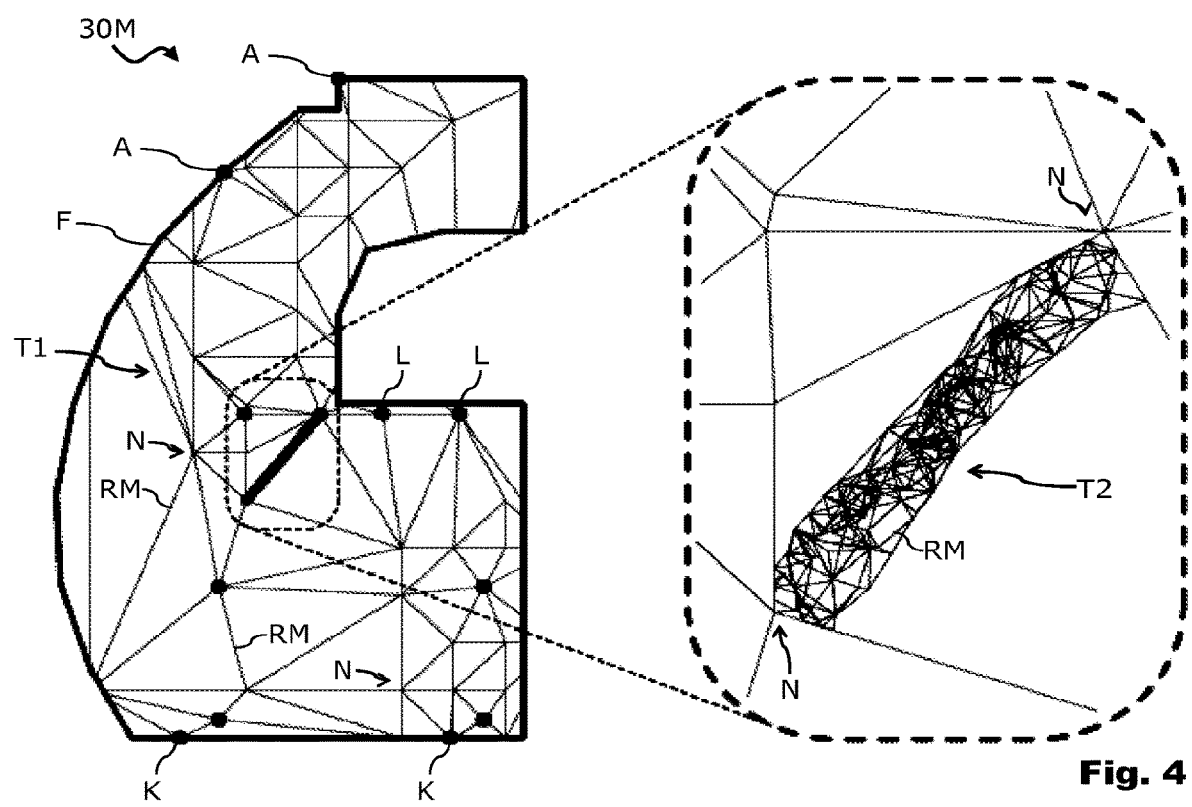
FIG. 4 schematically illustrates a further computational stage for a digital simulation model of the core panel of FIG. 2 according to another embodiment of the disclosure herein.

A computer-implemented method for designing the space frame topology of the space frame structure T1 of the core panel 30 will be exemplarily explained and described in conjunction with the FIGS. 3 to 5. The method may in particular employ metaheuristic optimization algorithms for optimizing the load paths through the truss of space frame rods R.

At first, existing geometry data is imported into a modelling software. The geometry data may be used to create a boundary representation of the potential design space, for example a carrier frame model F of the partition wall of the passenger cabin in an aircraft. Using a solid finite element analysis model, a load stress map may be calculated mapped to each point within the boundary representation of the potential design space. Representative loads may be applied in the simulation to study the internal load paths and stresses.

As shown in FIG. 3, the modelled carrier frame F may be provided with a plurality of attachment points A at the boundary of the design space defining the positions where loads and stress on the space frame is diverted into the surrounding structures and a plurality of load application points L where major loads are expected to be applied, for example mounting positions of an attachment panel 10 as shown in FIG. 1. Furthermore, the anchor points K at the carrier frame may be marked up as well in the design space. This definition creates a customized geometry as starting settings for the following generative network optimization algorithms.

As a starting network, a plurality of interconnecting lines between each two of the plurality of attachment points A and load application points L is created in the design space. Additionally, it may be possible to enrich the starting network of interconnecting lines with reinforcement lines. Those reinforcement lines may for example run between nodes N on one of the interconnecting lines and one of the plurality of attachment points A and load application points L in the design space. Alternatively or additionally, other reinforcement lines may run between two nodes N on neighboring ones of the interconnecting lines. The starting network thus comprises a much larger number of interconnecting and reinforcement lines than desired for the final space frame design. The starting network of lines (commonly referred to as modelled space frame rod lines RM in FIGS. 3 and 4) need then to be culled in order to arrive at a lower number of interconnecting and reinforcement lines which run along the expected load paths. Thus, the multi-objective optimization loop involves optimization towards at least minimum weight (corresponding to number of lines) and minimum displacement under predefined stress.

The multi-objective optimization loop may be subject to similar considerations as bionic path-finding models known from the adaptive growth of true slime molds. For example, Tero, A.; Kobyashi, R.; Nakagaki, T.; "A mathematical model for adaptive transport network in path finding by true slime mold", Journal of theoretical biology No. 244 vol. 4, pp. 553-564, Feb. 21, 2007, and Tero, A.; Takagi, S.; Saigusa, T.; Ito, K.; Bebber, D. P.; Fricker, M. D.; Yumiki, K.; Kobayashi, R.; Nakagaki, T.: "Rules for Biologically Inspired Adaptive Network Design", Science No. 327 vol. 5964, pp. 439-442, Jan. 22, 2010, both disclose core mechanisms and algorithms for adaptive network formation of true slime molds captured in a biologically inspired mathematical model.

Each of the interconnecting and/or reinforcement lines is parametrized with load application factors. The load application factors are derived from the previously calculated values of the load stress map. Then, the starting network of interconnecting and/or reinforcement lines is culled. Each culling procedure may run differently with different parameters defining the culling process, so that a plurality of different potential space frame designs is generated for further analysis. Culling parameters may for example comprise global line density, local line density and line length, or—in case of the reinforcement lines—node position on the interconnecting lines and length of the reinforcement lines.

The analysis may for example involve the use of an optimization engine that varies the input values of the parametric model. Each of the obtained potential space frame designs is evaluated with a performance score that may be obtained using a finite element analysis. The performance score may for example take into account a number of predefined optimization parameters, such as expected weight of the space frame rods manufactured according to the suggested space frame designs and deformation/displacement of the of the space frame rods manufactured according to the suggested space frame designs under external stress.

The potential space frame designs may for example be clustered in a multi-variate optimization parameter diagram to find space frame designs near the Pareto frontier so that only the potential space frame designs with the optimal performance score for each creation stage is selected for further analysis. The culling parameters for the best potential space frame designs, i.e. the space frame designs having the best performance score are selected for generatively determine a new set of combined culling parameters. Depending on the desired convergence speed, only those space frame designs having a performance score above a predefined performance threshold may be selected for this evolutionary procedure.

Then, a second generation of potential space frame designs is generated using the new set of combined culling parameters is generated which may again be subject to the performance evaluation. In this manner, more and more generations of potential space frame designs may be "evolved" on the basis of the best properties of the previous generations. The iteration process may in particular be terminated when the increment in performance score for subsequently generated potential space frame designs falls below a termination threshold.

One or several of space frame designs having an optimized macrostructure T1 are then selected for creating a custom generative geometry with an optimized microstructure T2. To that end, a truss model with a microstructural framework T2 is generated for each of the suggested macroscopic lines in the selected potential space frame designs. FIG. 4 exemplarily shows one of the finally selected space frame designs with the macrostructure T1 on the left side. The detail view on the right side exemplarily shows the microstructure T2 of the generated truss model for one of the modelled space frame rods RM. Again, the generation of the truss model is performed on the basis of corresponding values of the pre-calculated load stress map. The generated truss models are then employed as input geometry for an additive manufacturing, AM, process. Using the AM process, customized space frame rods may be manufactured that fulfil—when combined to a space frame—the desired aims of low weight, low material consumption and high mechanical stability.

Depending on the AM systems available or desired to be used, some or all of the space frame rods may be sub-divided into a number of partial space frame rods. Those partial space frame rods may in particular be limited to a predefined maximum length which may correspond to the maximum length that can be manufactured with the available AM systems. The subdivided partial space frame rods may then be equipped with one of the connector types C1 and C2 as shown in conjunction with FIG. 7. For example, the partial space frame rods may have an end portion formed as female-threaded rod connector ducts for connection to a male connector stud C. Alternatively, the partial space frame rods may be integrally formed with one of an angled pin connector RJ1 and an angled socket connector RJ2 at the respective end portions.

Figure 8:
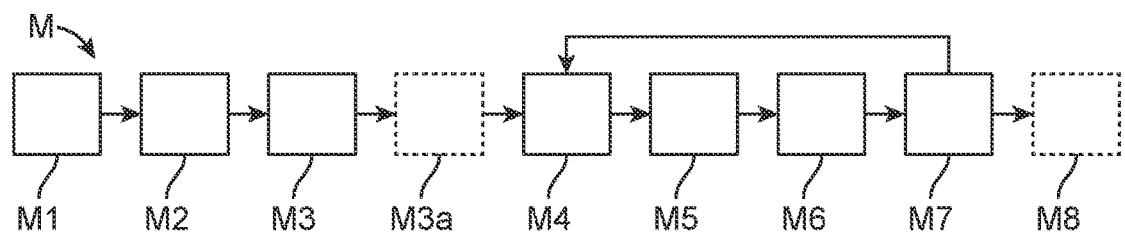
FIG. 8 schematically illustrates stages of a computer-implemented method for space frame design according to another embodiment of the disclosure herein.

FIG. 8 schematically illustrates stages of a computer-implemented method M for space frame design. The computer-implemented method M may for example be used to design the space frame for a structural component 100 of an aircraft the core panel 30 of which may be manufactured in an additive manufacturing process with the space frame design as obtained with the computer-implemented method M being used as base data for the additive manufacturing process.

In a first step M1, a load stress map is generated in a geometrical boundary representation of a design space. A second step M2 involves defining a plurality of attachment points A and load application points L in the design space. Between each two of the plurality of attachment points A and load application points L in the design space a starting network of interconnecting lines may be created in a third step M3.

Optionally, it may be possible to enrich the starting network with a plurality of reinforcement lines that run between a node N on one of the interconnecting lines and one of the plurality of attachment points A and load application points L in the design space or between two nodes N on neighboring ones of the interconnecting lines.

In a fourth step M, load application factors are mapped to each line of the starting network of interconnecting lines based on values of the load stress map so that a plurality of potential space frame designs may be generated in a fifth step M5 by selectively culling different subsets of lines of the starting network of interconnecting lines for each potential space frame design according to variable culling parameters.

Each of the plurality of potential space frame designs is evaluated with a performance score in a sixth step M6. This evaluation depends on a number of predefined optimization parameters. The culling parameters for the potential space frame designs may be combined in a step M7, specifically for those space frame designs the performance score of which is above a predefined performance threshold. In an evolutionary algorithm, the steps M5 of generating potential space frame designs and M6 of evaluating the potential space frame designs are iterated on the basis of the combined culling parameters.

The space frame construction kit as described as explained above is a cheap, extremely light and flexible system that allows for rapid construction and deconstruction of multiple structures of varying outer profile. The space frame construction kit may for example be used to build up a core panel of a structural aircraft component, such as for example an aircraft cabin partition wall. The structural aircraft component built with such a space frame construction kit is easy to repair and thus low in maintenance costs due to single damaged framework elements being readily replaceable. Moreover, owing to the modular construction of the structural aircraft component, geometry tolerances of the overall component may be easily compensated for by adjusting the connectors between the modular parts of the space frame.

A system according to some exemplary embodiments of the present disclosure may be provided which includes one or more processing arrangements such as may be found, e.g., in a personal computer or computer workstation. Such system can further include a set of instructions which are capable of configuring the processing arrangement to perform the exemplary computer-implemented methods described herein for designing, constructing, analysing and optimizing models of space frames and space frame components. The instructions can be provided on a computer-accessible medium such as a storage medium. One of skill in the art will recognize that the present disclosure may be implemented as one or more software processes executable by one or more processors and/or one or more software applications. Additionally, the present disclosure is not described with reference to any particular programming language. It will be appreciated that a variety of programming languages may be used to implement the teachings of the disclosure herein as described herein. It is also to be understood that the methods may be embodied on any form of memory device or storage medium including all forms of sequential, pseudo-random, and random access storage devices. Storage media as known within the current art include all forms of random access memory, magnetic and optical tape, magnetic and optical disks, along with various other forms of solid-state mass storage devices, for example a hard drive, a CD-ROM or DVD-ROM, a tape or floppy disk, a flash drive, or any other solid-state memory storage medium.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

The embodiments were chosen and described in order to best explain the principles of the disclosure herein and its practical applications, to thereby enable others skilled in the art to best utilize the disclosure herein and various embodiments with various modifications as are suited to the particular use contemplated. In the appended claims and throughout the specification, the terms "including" and "in which" are used as the plain-English equivalents of the respective terms "comprising" and "wherein," respectively. While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

What is claimed is:

1. A computer-implemented method, comprising:
defining a plurality of attachment points and load application points in a design space;
generating a starting network of interconnecting lines based on the plurality of attachment points and load application points in the design space;
assigning load application factors to each line included the starting network based on values from a load stress map;
performing one or more culling operations on the interconnected lines included in the starting network based on one or more culling parameters to generate a plurality of potential truss structure designs;
computing a performance score for each potential truss structure design included in the plurality of potential truss structure designs based on one or more predefined optimization parameters; and
generating at least one truss model based on the starting network and one or more potential truss structure designs selected in accordance with one or more performance scores.

2. The computer-implemented method of claim 1, further comprising combining the one or more culling parameters for the potential truss structure designs having performance scores above a predefined performance threshold.

3. The computer-implemented method of claim 2, further comprising iterating the steps of performing one or more culling operations to generate a plurality of truss structure designs, and computing a performance score for each potential truss structure design included in the plurality of potential truss structure designs based on the combined culling parameters.

4. The computer-implemented method of claim 3, wherein the steps of performing one or more culling operations to generate a plurality of truss structure designs, and computing a performance score for each potential truss structure design included in the plurality of potential truss structure designs are iterated until an increment in a performance score for a subsequently generated potential truss structure design falls below a termination threshold.

5. The computer-implemented method of claim 1, wherein the one or more culling parameters comprise at least one of a global line density, a local line density, or a line length.

6. The computer-implemented method of claim 1, further comprising generating one or more reinforcement lines between a node on one of the interconnecting lines and one of the plurality of attachment points and load application points included in the design space.

7. The computer-implemented method of claim 6, wherein the one or more culling parameters comprise at least one of a node position on the interconnecting lines or a length of the reinforcement lines.

8. The computer-implemented method of claim 1, further comprising generating one or more reinforcement lines between two nodes on neighboring interconnected lines.

9. The computer-implemented method of claim 1, the performance score for each potential truss structure design is computed using a finite element analysis.

10. The computer-implemented method of claim 1, further comprising clustering the potential truss structure designs in a multi-variate optimization parameter diagram to find one or more truss structure designs near a Pareto frontier.

11. The computer-implemented method of claim 1, wherein the at least one truss model is employed as input geometry for an additive manufacturing process for manufacturing a plurality of truss structure rods.

12. The computer-implemented method of claim 11, further comprising sub-dividing a plurality of truss structure rods into a number of partial truss structure rods having a predefined maximum length.

13. One or more non-transitory computer-readable media including instructions that, when executed by one or more processors, cause the one or more processors to perform the steps of:
    defining a plurality of attachment points and load application points in a design space;
    generating a starting network of interconnecting lines based on the plurality of attachment points and load application points in the design space;
    performing one or more culling operations on the interconnected lines included in the starting network based on one or more culling parameters to generate a plurality of potential truss structure designs;
    computing a performance score for each potential truss structure design included in the plurality of potential truss structure designs based on one or more predefined optimization parameters; and
    generating at least one truss model based on the starting network and one or more potential truss structure designs selected in accordance with one or more performance scores.

14. The one or more non-transitory computer-readable media of claim 13, further comprising combining the one or more culling parameters for the potential truss structure designs having performance scores above a predefined performance threshold.

15. The one or more non-transitory computer-readable media of claim 14, further comprising iterating the steps of performing one or more culling operations to generate a plurality of truss structure designs, and computing a performance score for each potential truss structure design included in the plurality of potential truss structure designs based on the combined culling parameters.

16. The one or more non-transitory computer-readable media of claim 15, wherein the steps of performing one or more culling operations to generate a plurality of truss structure designs, and computing a performance score for each potential truss structure design included in the plurality of potential truss structure designs are iterated until an increment in a performance score for a subsequently generated potential truss structure design falls below a termination threshold.

17. The one or more non-transitory computer-readable media of claim 13, wherein the one or more culling parameters comprise at least one of a global line density, a local line density, or a line length.

18. The one or more non-transitory computer-readable media of claim 13, further comprising generating one or more reinforcement lines between a node on one of the interconnecting lines and one of the plurality of attachment points and load application points included in the design space.

19. The one or more non-transitory computer-readable media of claim 18, wherein the one or more culling parameters comprise at least one of a node position on the interconnecting lines or a length of the reinforcement lines.

20. The one or more non-transitory computer-readable media of claim 13, further comprising generating one or more reinforcement lines between two nodes on neighboring interconnected lines.

21. The one or more non-transitory computer-readable media of claim 13, the performance score for each potential truss structure design is computed using a finite element analysis.

22. The one or more non-transitory computer-readable media of claim 13, further comprising clustering the potential truss structure designs in a multi-variate optimization parameter diagram to find one or more truss structure designs near a Pareto frontier.

23. The one or more non-transitory computer-readable media of claim 13, wherein the at least one truss model is employed as input geometry for an additive manufacturing process for manufacturing a plurality of truss structure rods.

24. The one or more non-transitory computer-readable media of claim 23, further comprising sub-dividing a plurality of truss structure rods into a number of partial truss structure rods having a predefined maximum length.

25. A system, comprising:
    one or more memories storing instructions; and
    one or more processors that are coupled to the one or more memories and, when executing the instructions, are configured to perform the steps of:
        defining a plurality of attachment points and load application points in a design space;
        generating a starting network of interconnecting lines based on the plurality of attachment points and load application points in the design space;
        generating a plurality of potential truss structure designs based on one or more interconnected lines included in the starting network;
        computing a performance score for each potential truss structure design included in the plurality of potential truss structure designs based on one or more predefined optimization parameters; and
        generating at least one truss model based on the starting network and one or more potential truss structure designs selected in accordance with one or more performance scores.

* * * * *